United States Patent
Shah et al.

(10) Patent No.: US 9,459,357 B2
(45) Date of Patent: Oct. 4, 2016

(54) CSLILN HALIDE SCINTILLATOR

(71) Applicant: Radiation Monitoring Devices, Inc., Watertown, MA (US)

(72) Inventors: Kanai S. Shah, Watertown, MA (US); William M. Higgins, Westborough, MA (US); Edgar V. Van Loef, Watertown, MA (US); Jaroslaw Glodo, Allston, MA (US); Rastgo Hawrami, Watertown, MA (US); Urmila Shirwadkar, Watertown, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 0 days.

(21) Appl. No.: 14/603,989

(22) Filed: Jan. 23, 2015

(65) Prior Publication Data

US 2015/0268363 A1  Sep. 24, 2015

Related U.S. Application Data

(63) Continuation of application No. 13/891,771, filed on May 10, 2013, now Pat. No. 8,969,824, which is a continuation of application No. 12/731,003, filed on Mar. 24, 2010, now Pat. No. 8,440,980, which is a continuation-in-part of application No. 12/624,337, filed on Nov. 23, 2009, now abandoned.

(60) Provisional application No. 61/230,970, filed on Aug. 3, 2009.

(51) Int. Cl.
*G01T 1/20* (2006.01)
*G01T 3/06* (2006.01)
*G01T 1/202* (2006.01)
*C09K 11/77* (2006.01)
*C01F 17/00* (2006.01)
*C30B 11/00* (2006.01)
*C30B 15/00* (2006.01)
*C30B 29/12* (2006.01)

(52) U.S. Cl.
CPC ............ *G01T 3/06* (2013.01); *C01F 17/0056* (2013.01); *C01F 17/0068* (2013.01); *C09K 11/772* (2013.01); *C09K 11/7705* (2013.01); *C09K 11/778* (2013.01); *C09K 11/7733* (2013.01); *C09K 11/7773* (2013.01); *G01T 1/202* (2013.01); *G01T 1/2006* (2013.01); *C30B 11/00* (2013.01); *C30B 15/00* (2013.01); *C30B 29/12* (2013.01)

(58) Field of Classification Search
CPC ................................. G01T 1/20; G01T 1/167
See application file for complete search history.

(56) References Cited

PUBLICATIONS

"Luminescence and scintillation properties of Cs2LiYCl6:Ce3+ for y and neutron detection", Nuclear Instruments and Methods in Physics Research A 537 242-246.*
"Scintillation Properties of 1 inch Cs2LiYCl6:Ce Crystals", IEEE Transactions on Nuclear Science, vol. 55, No. 3, Jun. 2008, p. 1206-1209.*

* cited by examiner

*Primary Examiner* — David Porta
*Assistant Examiner* — Hugh H Maupin
(74) *Attorney, Agent, or Firm* — Wolf, Greenfield & Sacks, P.C.

(57) ABSTRACT

Li-containing scintillator compositions, as well as related structures and methods are described. Radiation detection systems and methods are described which include a $Cs_2LiLn$ Halide scintillator composition.

17 Claims, 8 Drawing Sheets

CSLILN HALIDE SCINTILLATOR

CROSS REFERENCE TO RELATED APPLICATIONS

The present application is a continuation of U.S. patent application Ser. No. 13/891,771, filed May 10, 2013, which is a continuation of U.S. patent application Ser. No. 12/731,003, filed Mar. 24, 2010 which is a continuation-in-part application of U.S. patent application Ser. No. 12/624,337, filed on Nov. 23, 2009, which claims the benefit of priority under 35 U.S.C. §119(e) of U.S. Provisional Application No. 61/230,970, filed Aug. 3, 2009, which are incorporated herein by reference in their entirety.

BACKGROUND OF THE INVENTION

The present invention relates to scintillator compositions and related devices and methods. More specifically, the present invention relates to enriched Li-containing scintillator compositions suitable for use, for example, in radiation detection, including gamma-ray spectroscopy, and X-ray and neutron detection.

Scintillation spectrometers are widely used in detection and spectroscopy of energetic photons (e.g., X-rays, gamma-rays, etc.). Such detectors are commonly used, for example, in nuclear and particle physics research, medical imaging, diffraction, non destructive testing, nuclear treaty verification and safeguards, nuclear non-proliferation monitoring, and geological exploration.

Important requirements for the scintillation crystals used in these applications include high light output, transparency to the light it produces, high stopping efficiency, fast response, good proportionality, low cost, and availability in large volume. These requirements on the whole cannot be met by many of the commercially available scintillator compositions. While general classes of chemical compositions may be identified as potentially having some attractive scintillation characteristic(s), specific compositions/formulations having both scintillation characteristics and physical properties necessary for actual use in scintillation spectrometers and various practical applications have proven difficult to predict. Specific scintillation properties are not necessarily predictable from chemical composition alone, and preparing effective scintillator compositions from even candidate materials often proves difficult For example, while the compositions of sodium chloride and sodium iodide had been known for many years, the invention by Hofstadter of a high light-yield and conversion efficiency scintillator from sodium iodide doped with thallium launched the era of modern radiation spectrometry. More than half a century later, thallium doped sodium iodide, in fact, still remains one of the most widely used scintillator materials. Since the invention of NaI(T1) scintillators in the 1940's, for half a century radiation detection applications have depended to a significant extent on this material. The fields of nuclear medicine, radiation monitoring, and spectroscopy have grown up supported by NaI(T1). Although far from ideal, NaI(T1) was relatively easy to produce for a reasonable cost and in large volume. With the advent of X-ray CT in the 1970's, a major commercial field emerged as did a need for different scintillator compositions, as NaI(T1) was not able to meet the requirements of CT imaging. Later, the commercialization of positron emission tomography (PET) imaging provided the impetus for the development of yet another class of detector materials with properties suitable for PET.

As the methodology of scintillator development evolved, new materials have been added, and yet, specific applications are still hampered by the lack of scintillators suitable for particular applications. Today, the development of new scintillator compositions continues to be as much an art as a science, since the composition of a given material does not necessarily determine its properties as a scintillator, and because scintillation properties are strongly influenced by the history (e.g., fabrication process) of the material as it is formed.

Thus, there is continued interest in the search for new and useful scintillator compositions and formulations, as well as corresponding detection systems, with both the performance and the physical characteristics needed for use in various applications.

BRIEF SUMMARY OF THE INVENTION

The present invention provides Li-containing scintillator compositions, as well as related structures and methods. Compositions include Cs2LiLn Halide ($Z_6$) scintillator compositions.

In one aspect, structures and methods of the present invention include a scintillator comprising a $Cs_2LiLn$ Halide composition. Ln is selected from one or more of Y, La, Ce, Gd, Lu and Sc, and the halide comprises at least Cl. The scintillator is capable of neutron detection at an efficiency of greater than 30%. In some of these embodiments. In some embodiments, the lithium content of the composition is enriched to include a Li-6 content above that which is found in naturally occurring lithium sources. In some embodiments, the scintillator compositions disclosed herein can include a dopant or a mixture of dopants.

In one aspect, a detection system is provided. The system comprises a scintillator comprising a $Cs_2LiLn$ Halide composition. Ln is selected from one or more of Y, La, Ce, Gd, Lu and Sc. The Halide comprises at least Cl, wherein the scintillator is capable of neutron detection at an efficiency of greater than 30%. The system further comprises a detector assembly coupled to the scintillator to detect a light pulse luminescence from the scintillator as a measure of a neutron scintillation event.

In one aspect, a method of radiation detection is provided. The method comprises providing a detection system comprising a scintillator comprising $Cs_2LiLn$ Halide composition. Ln is selected from one or more of Y, La, Ce, Gd, Lu and Sc, wherein the Halide comprises at least Cl. The detection system further comprises a detection assembly coupled to the scintillator to detect a light pulse luminescence from the scintillator as a measure of a scintillation event. The method further comprises positioning the system such that a radiation source is within a field of view of the system so as to detect emissions from the source and measuring a scintillation event luminescence signal from the scintillator with the detection assembly. The method further comprises processing the measured luminescence signal using pulse shape discrimination analysis over a time of greater than 50 ns to differentiate between gamma emissions and neutron emissions from the source.

In some aspects, a method of radiation detection is provided. The method comprises providing a detection system comprising a scintillator comprising $Cs_2LiLn$ Halide composition. Ln is selected from one or more of Y, La, Ce, Gd, Lu and Sc, wherein the Halide comprises at least Cl. The detection system further comprises a detection assembly coupled to the scintillator to detect a light pulse luminescence from the scintillator as a measure of a scintillation event. The method further comprises positioning the system such that a radiation source is within a field of view of the system so as to detect emissions from the source and measuring a scintillation event luminescence signal from the scintillator with the detection assembly. The method further comprises processing the measured luminescence signal comprising comparing the measured luminescence signal from a first window of time to the measured luminescence signal from a second window of time.

Excellent scintillation properties, including high light output, good proportionality, response, and good energy resolution have been measured for certain compositions of the present invention. Scintillator compositions of the present invention have demonstrated emission characteristics indicating suitability for use in various applications. For example, scintillation properties of the compositions can include peak emission wavelengths from about 380 nm, which is well matched to PMTs as well as silicon diodes used in nuclear instrumentation and a peak wavelength for gamma-ray spectroscopy.

The present invention, in some aspects, advantageously provides high-efficiency neutron detection compositions and structures. Thus, compositions of the present invention may be used in a variety of radiation detection structures and applications.

Scintillator compositions demonstrated suitability for gamma-ray spectroscopy and neutron emission detection, including differential gamma-ray/neutron detection. Surprisingly good energy resolution of the compositions make the scintillators of the present invention particularly attractive for combined or simultaneous gamma and neutron detection. Additionally, timing characteristics such as rise time and decay time for gamma-ray and neutron may be utilized in differential detection of gamma-ray scintillation events and neutron events. In one embodiment, detection includes measuring and/or processing a scintillation luminescence signal including comparing different timing windows so as to identify a scintillation event as a gamma event or neutron event.

In another aspect, the invention further includes systems and devices making use of the scintillator compositions of the present invention. A system or device can include, for example, a radiation detection device having a scintillation composition as described herein, and a detector assembly optically coupled to the scintillator composition. A detector assembly can include, for example, a photomultiplier tube, a photo diode, or a PIN detector. The detector assembly may further include a data analysis, or computer, system for processing and analyzing detected signals. Exemplary devices or assemblies can include an X-ray and/or neutron detector assembly, as well as imaging systems. For example, the device can include electronics configured for performing pulse shape and pulse height analysis to differentiate gamma ray from neutron emissions. Scintillator compositions of the present invention can further find use in a variety of detector or imaging system configurations commonly using scintillator compositions, and methods of the present invention can include radiation detection and/or imaging applications using the aforementioned devices/systems.

In yet another aspect, the invention includes a method of performing radiation detection. Such a method can include, for example, providing a detection system or device having a scintillator composition of the present invention, and the system or a target/radiation source such that the source is within a field of view of the scintillator for detecting emissions from the target or source. Emissions can include, for example, gamma-ray, X-ray, or neutron emissions. A target can include various potential sources of detectable emissions including neutron emitters and gamma-ray sources (e.g., uranium and the like), X-ray sources, etc.

For a fuller understanding of the nature and advantages of the present invention, reference should be made to the ensuing detailed description taken in conjunction with the accompanying drawings. The drawings represent embodiments of the present invention by way of illustration. The invention is capable of modification in various respects without departing from the invention. Accordingly, the drawings/figures and description of these embodiments are illustrative in nature, and not restrictive.

DETAILED DESCRIPTION OF THE INVENTION

Figure 1:
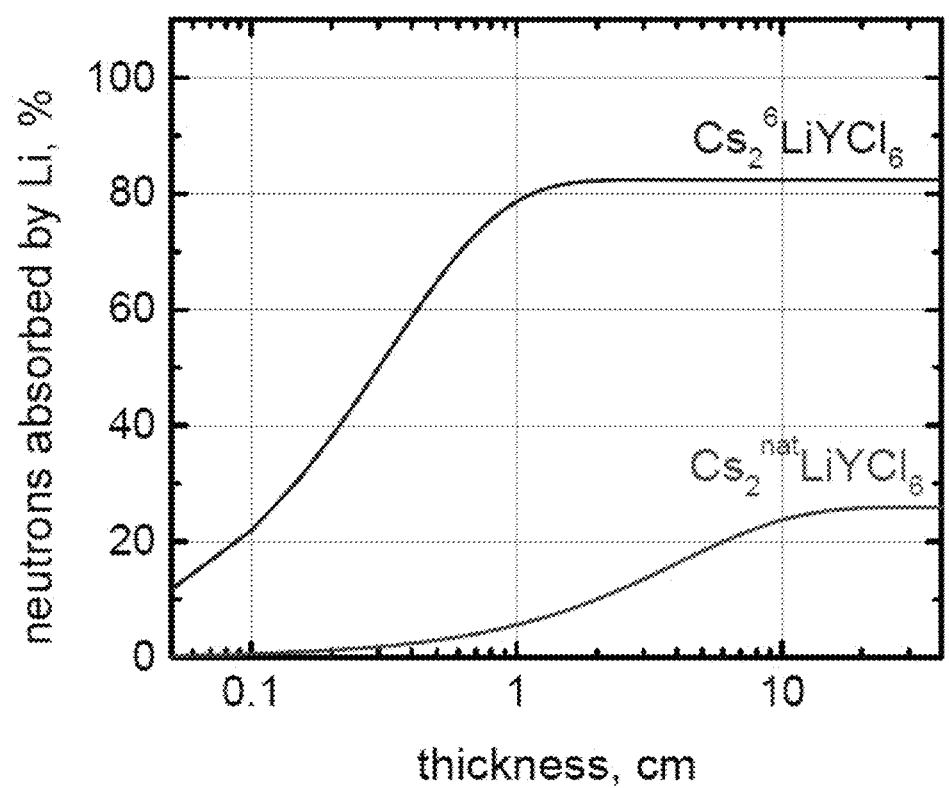
FIG. 1 shows neutron absorption efficiency as a function of scintillator thickness for a non-enriched $Cs_2LiYCl_6$ and a Li-6 enriched $Cs_2LiYCl_6$ scintillator composition.

This invention will be better understood with resort to the following definitions:

A. Rise time, in reference to a scintillation crystal material, shall mean the speed with which its light output grows once a gamma-ray has been stopped in the crystal. The contribution of this characteristic of a scintillator contributes to a timing resolution.

B. A Fast timing scintillator (or fast scintillator) typically requires a timing resolution of about 500 ps or less. For certain PET applications (e.g., time-of-flight (TOF)), the fast scintillator should be capable of localizing an annihilation event as originating from within about a 30 cm distance, i.e., from within a human being scanned.

C. Timing accuracy or resolution, usually defined by the full width half maximum (FWHM) of the time of arrival differences from a point source of annihilation gamma-rays.

Because of a number of factors, there is a spread of measured values of times of arrival, even when they are all equal. Usually they distribute along a bell-shaped or Gaussian curve. The FWHM is the width of the curve at a height that is half of the value of the curve at its peak.

D. Light Output shall mean the number of light photons produced per unit energy deposited by the detected gamma-ray, typically the number of light photons/MeV. For neutrons, the light output is typically measured in photons/neutron.

E. Stopping power and attenuation refer to the penetration range of the incoming X-ray or gamma-ray in the scintillation crystal material. Attenuation is the gradual loss of intensity of a flux through a medium. The attenuation length, in the context of a scintillator, is the length of scintillator material needed to reduce the incoming beam flux to $1/e^-$. For neutrons, the attenuation length and the useful attenuation length may differ. For instance, for $Cs_2LiYZ_6$ scintillator compositions, neutrons are stopped by all of the elements in the composition, with those stopped by Li-6 provide a useful signal. F. Proportionality of response (or linearity). For some applications (such as CT scanning) it is desirable that the light output be substantially proportional to the deposited energy. For applications such as spectroscopy, non-proportionality of response is an important parameter. In a typical scintillator, the number of light photons produced per MeV of incoming gamma-ray energy is not constant. Rather, it varies with the energy deposited by the stopped gamma-ray. This has two deleterious effects. The first is that the energy scale is not linear, but it is possible to calibrate for the effect. The second is that it degrades energy resolution. To see how this occurs, consider a scintillator that produces 300 photons at 150 keV, 160 photons at 100 keV and 60 photons at 50 keV. From statistics alone, the energy resolution at 150 keV should be the variability in 300 photons, which is 5.8%, or 8.7 keV. If every detected event deposited 150 keV in one step this would be the case. On the other hand, if, as it occurs, an event deposited 100 keV in a first interaction and then another 50 keV in a second interaction, the number of photons produced would not be 300 on the average, but 160+60=220 photons, for a difference of 80 photons or 27%. In multiple detections, the peak would broaden well beyond the theoretical 8.7 keV. The smaller the non-proportionality the smaller this broadening and the closer the actual energy resolution approaches the theoretical limit.

The present invention includes compositions and related radiation detection systems incorporating a $Cs_2LiLn$ Halide composition. The compositions may be represented by the formula $Cs_2LiLnZ_6$, where Z is a halide. Suitable halides can include, for example, F, Cl, Br, or I, or a mixture of two or more halides. Lanthanides (or "Ln") can include lanthanides such as Y, La, Ce, Gd, Lu, Sc, etc. In some embodiments, the composition includes a mixture of lanthanide elements. In some embodiments, a scintillator includes a $Cs_2LiYCl_6$ composition.

In some embodiments, the lithium content of the composition is enriched to include a Li-6 content above that which is found in naturally occurring lithium sources. It should be understood, however, that not all compositions of the invention are enriched. Enrichment refers to a change through processing of a nuclear species mixture found on Earth or as naturally occurring so that the resultant material has a different mix of nuclear species. In naturally occurring sources of lithium, 93% of the lithium is in the form of Li-7 or $^7Li$, having an atomic weight of approximately 7 and includes a nucleus with three protons (defining the chemical species) and four neutrons. Approximately 7% of naturally occurring lithium is Li-6 or $^6Li$, which has an atomic weight of approximately six, including three protons and three neutrons. Although the chemical properties are substantially similar, the physical (weight) and nuclear properties are significantly different. Of interest in the compositions of the present invention is that the neutron interaction cross-section of Li-6 is larger than that of Li-7.

Thus, Li-6 enriched compositions of the present invention will include compositions where the Li-6 content is higher or above that which is found in naturally occurring lithium sources. Compositions can include lithium with a Li-6 content that is at least about 10% or higher, and will typically include lithium with a Li-6 content of about 50% or more, and in some instances about 80%, 90%, 95% or more (as well as any integral number in the specified ranges).

Most neutron detection applications demand high detection efficiency. In neutron radiography is important to keep exposure to neutrons low, e.g., since the interaction of neutrons with many materials results in chemical transformations that alter the properties of these materials by transmuting elements, and some can become radioactive for long times, this latter factor complicating handling and disposal. In certain applications, radiation sources of interest may have low-level neutron emissions or low ratio of neutron to gamma-ray emission, thereby requiring a high-efficiency detector for meaningful analysis or effective detection. In the nuclear security or monitoring applications, e.g., radiation sources or materials of interest have a low ratio of neutron emissions relative to gamma-rays, such as one neutron per thousand or more gamma-rays, thus making neutron detection efficiency and neutron discrimination from gamma rays key factors for detection and/or analysis applications.

While the detection efficiency of unenriched material might seemingly be augmented simply by making thicker detectors, this is not necessarily the case. In practice, detector efficiency is not found to be directly proportional to scintillator thickness, and merely increasing thickness produces diminishing return in terms of efficiency. As an example illustrating limitations in merely increasing thickness as a measure to increase efficiency, the following example is provided. For gamma rays, on first order, for a given scintillator, if a thickness 1× of material stops 30% of the incoming gamma-rays, then 2× stops 51% and 3× 66% and so on. The reason is that substantially all gamma rays interacting in the material produce detectable light. Limitations on size/volume of scintillator that can practically be incorporated into a device restricts the usefulness of certain compositions that are unable to provide a desired detection efficiency with a thickness that is practical or useful.

In the case of non-enriched $Cs_2LiYCl_6$, for instance, the Cs and Cl (mainly the latter) do stop some of the neutrons but do not correspondingly produce useful neutron detection signal, so as the detector is made thicker it becomes opaque to neutrons. Thus, as scintillator thickness increases the Li component does decreasing proportion of useful work because the Li-6 component competes for neutrons with the Cl, which as noted above does not interact with neutrons so as to produce a useful signal. As a consequence, because the neutron absorption per unit thickness/length of scintillator material for non-enriched $Cs_2LiYCl_6$ is limited, the maximum neutron detection efficiency of such material is limited even as the thickness increases. For example, a scintillator composition of non-enriched $Cs_2LiYCl_6$ may gain some increased neutron detection efficiency as thickness is increased up to about 10 cm, but further doubling the thickness from 10 cm to 20 cm produces minimal further gains in neutron detection efficiency (see FIG. 1). The maximum detection efficiency for any thickness is approximately 27%. It is noted that, separate for the issue of detection efficiency, as scintillator thickness increases to a range of about 10 cm to about 20 cm, practically application of such thick scintillators, particularly in more portable or hand held detector configurations, becomes more limited and even precludes some applications.

The scintillator compositions of the present invention may include a lithium component that is enriched with Li-6, e.g., compared to Li-7. The enriched compositions advantageously allow high-efficiency neutron detection with relatively thin scintillator configurations, thereby allowing practical application of the compositions in a variety of detection devices that would not otherwise be available with a corresponding non-enriched composition. Since in one embodiment, lithium enriched to the level of 95% Li-6 is available, high-efficiency scintillators can be produced using enriched material, and can optionally include a thin scintillator profile. As will be recognized, neutron detection efficiency increases when the ratio of neutrons incident to the scintillator that generate a scintillation event or detectable signal compared to neutrons incident to the scintillator not generating a scintillation event or signal is higher. A "high-efficiency" detector, as referred to herein, can include a detector where the scintillator composition is capable of neutron detection at an efficiency of about 30% or more, and/or an incorporating device/system will be configured for detection at an efficiency about 30% or more. In some embodiments, the scintillator composition is capable of neutron detection at an efficiency of about 50% or more; in some embodiments, the scintillator composition is capable of neutron detection at an efficiency of about 75% or more. Often, a detector device or system of the present invention will include a neutron detection efficiency in a range of about 20% to about 80% or greater (and any integral number therebetween). For 95% enriched material the maximum detection efficiency for any thickness is approximately 82%, approximately 3 times higher than for unenriched material, and this is attained for a thickness that is approximately 1/10th of the thickness of unenriched material.

The terms "thick" and "thin" are used herein in reference to a scintillator thickness or distance from one surface to an opposing surface (see, also, FIG. 8B, below). In some instances, reference to thickness or thinness refer to scintillators having a thickness of about 20 cm or less (e.g., 0.01 cm to about 20 cm, or any integral number therebetween), typically less than about 10 cm. In some instances, scintillators are less than about 1 cm and may have portion of about 1 mm to about 5 mm in thickness. In some cases, the scintillators have a thickness of greater than 1 cm; in some cases, greater than 5 cm; in some cases, greater than 10 cm; and, in some cases, greater than 20 cm. In some cases, the terms thick or thin are used in a relative manner, such as referring to the thickness/thinness of an enriched scintillator composition compared to a corresponding non-enriched composition.

Enriched compositions of the present invention in some embodiments may provide significantly greater neutron detection efficiency per unit thickness compared to a corresponding non-enriched composition. In many instances, enriched scintillator compositions will provide thin scintillators that are high-efficiency neutron detecting scintillators, and the present invention includes high-efficiency neutron detection systems/structures making use of relatively thin enriched scintillator compositions.

Increased neutron detection efficiency per unit thickness in enriched scintillator compositions of the present invention is described with reference to FIG. 1. As can be seen in FIG. 1, in one example, a Li-6 enriched $Cs_2LiYCl_6$ of 1 cm in thickness is capable of detecting through scintillation about 80% of the neutrons reaching the scintillator, with a maximum detection efficiency of about 82% is reached at about 1.5 cm of material thickness. In contrast, a 10 cm thick corresponding unenriched $Cs_2LiYCl_6$ material detects approximately 23% of the neutrons, and 20 cm of unenriched material detect 27%. Remarkably, the about maximum detection efficiency (about 27%) of the unenriched $Cs_2LiYCl_6$ that is reached at about 20 cm-thickness, is matched by the Li-6 enriched $Cs_2LiYCl_6$ of the present invention at a thickness of just over 1 mm.

Figure 2:
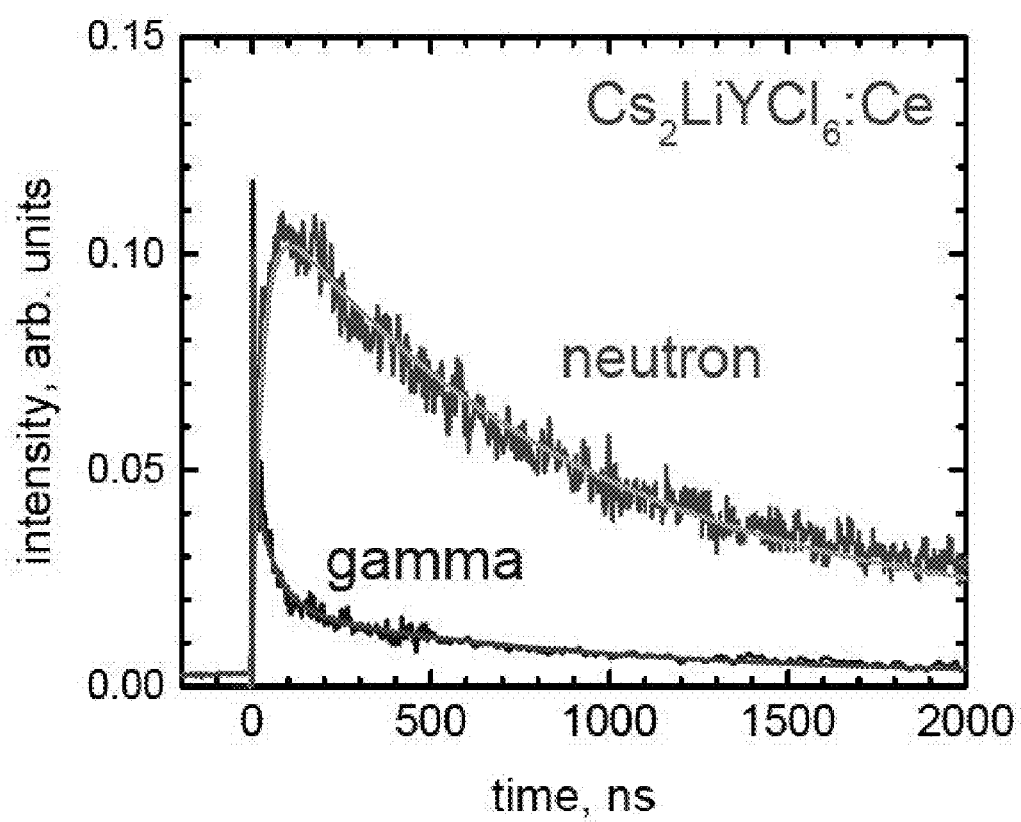
FIG. 2 shows time profiles for gamma-ray and neutron detection for a $Cs_2LiYCl_6$ scintillator composition, according to an embodiment of the present invention.

One of the valuable characteristics of the scintillator of the present invention is the ability to differentiate neutrons from gamma rays. The principle behind discrimination is described with reference to FIGS. 2-4. FIG. 2 shows the time course of light emission by gamma rays and neutrons obtained from a small scintillator crystal of $Cs_2LiYCl_6$ doped with Ce. As can be seen, timing profile of a gamma-ray scintillation event differs compared to neutron scintillation event. For incident gamma-rays, scintillation is very fast, including a fast light decay where 1/e was reached in less than 100 nsec. Neutron scintillation event exhibits a relatively slower timing profile, the 1/e point being reached at about 500 ns. The difference in the timing profile between gamma-ray scintillation events and neutron scintillation events can facilitate differentiation between gamma-ray detection and neutron detection. In particular, such differences enable gamma-ray detection and neutron detection to be differentiated using pulse shape discrimination (PSD) analysis. PSD analysis, in general, involves comparing the luminescence signal pulse shape resulting from gamma-ray detection to the luminescence signal pulse shape resulting from neutron detection. In some embodiments, it may be advantageous to use PSD analysis over relatively long time periods to differentiate gamma-ray detection and neutron detection. For example, in some embodiments, methods of differentiating gamma-rays from neutrons involve analyzing the luminescence signal over a time of greater than 50 ns; in some cases, over a time of greater than 100 ns; or, in some cases, over a time of greater than 150 ns. Relatively long PSD times are particularly useful in embodiments when the scintillator is relatively thick, for example, greater than 1 cm, greater than 5 cm, etc.

Figure 3:
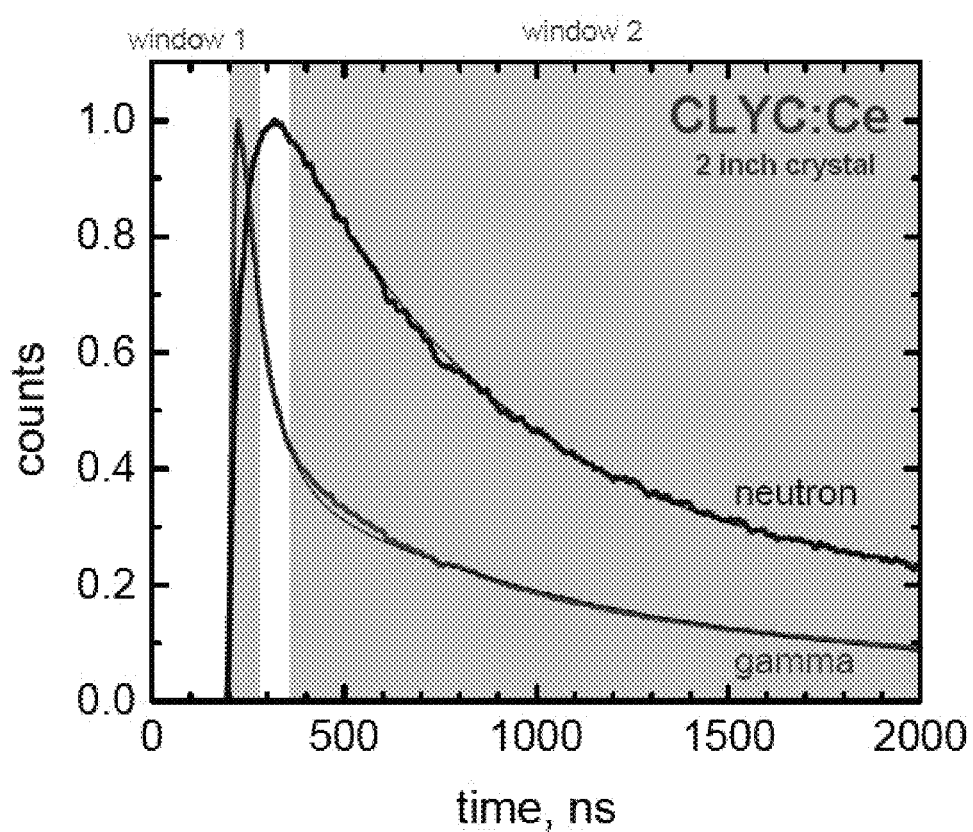
FIG. 3 shows time profiles for gamma-ray and neutron detection for a scintillator composition, according to an embodiment of the present invention, with a first timing window and a second timing window for differentiation of gamma-ray and neutron scintillation event signal.
Figure 4:
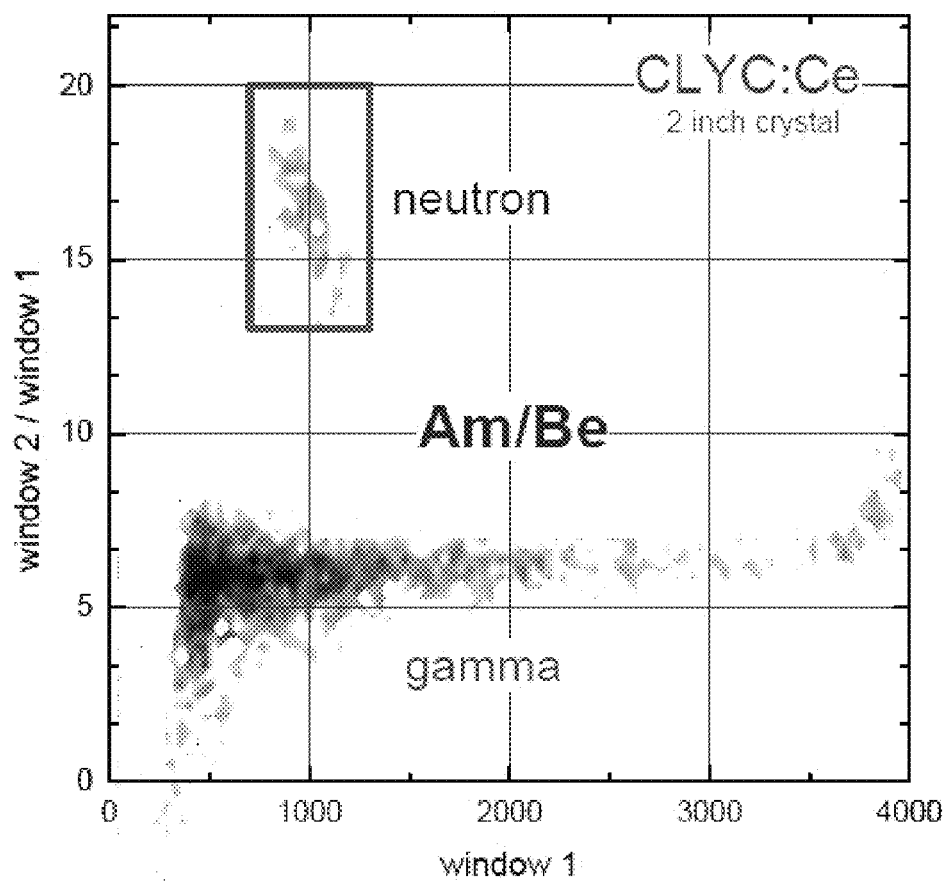
FIG. 4 illustrates comparison of different portions of scintillation event signal, as in FIG. 3, for differentiation of gamma-ray and neutron events, according to one embodiment of the present invention.

FIG. 3 shows a method to use rise time to effect gamma ray/neutron discrimination in larger crystals by placing two time windows from which to accumulate (integrate) or process the luminescence signal. In the illustrative embodiment, window 1 is on the rise and window 2 on the decay sides of the time course. In some embodiments, window 1 has a time duration of at least 50 ns, or at least 100 ns. In some cases, the time duration for window 1 is less than 150 ns, less than 125 ns, or less than 100 ns. Window 1 may be between 0 and 100 ns, as measured from the start of the luminescence signal. In some embodiments, window 2 has a time duration of at least 50 ns, at least 100 ns (e.g., between 100-125 ns), at least 200 ns, or at least 300 ns. In some cases, the time duration for window 2 is less than 400 ns, less than 300 ns or less than 200 ns. Window 2 may be between 100 ns and 500 ns, as measured from the start of the luminescence signal. Analysis can include a comparison of windows 1 and 2 so as to identify a scintillation event as a gamma event or neutron event. The analysis may include assessing the ratio of the value of the integrated signal within the first time window and the second time window. The ratio will be different for events due to gamma-ray and neutrons and, thus, can be used to differentiate. FIG. 4 shows comparison according to one embodiment, where a plot of window 2/window 1 vs. window one shows the neutron and gamma-ray events well identified.

Figure 5:
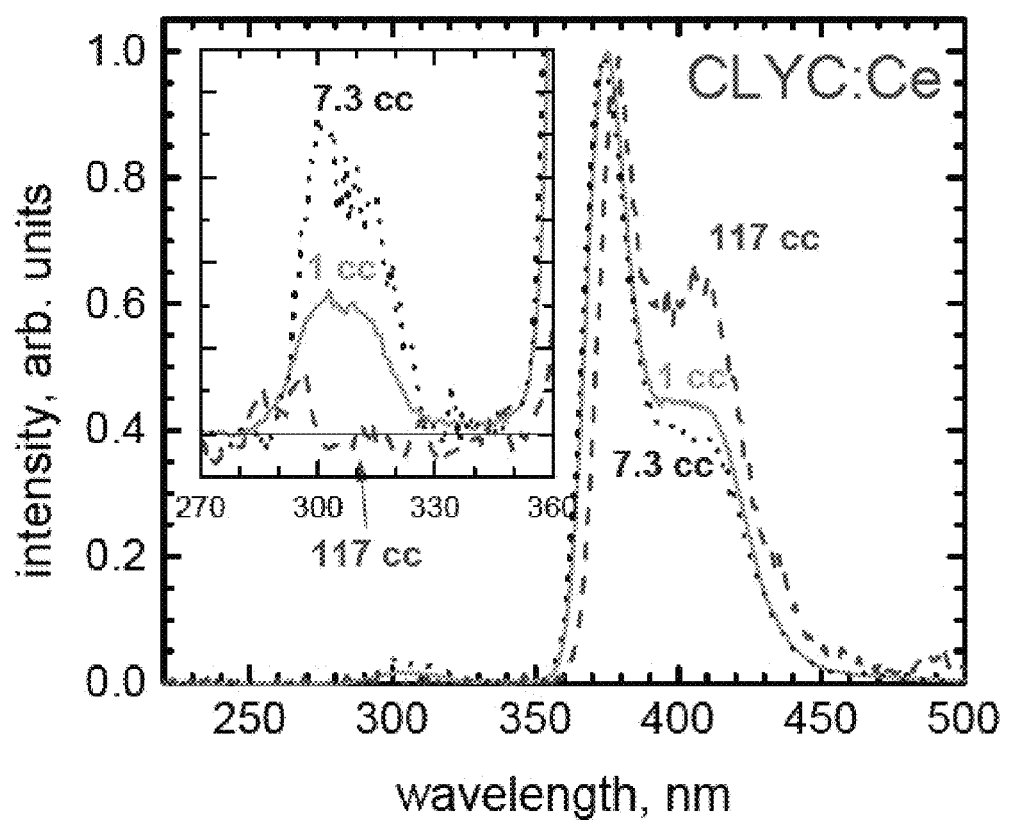
FIG. 5 shows an optical emission spectrum for a Ce doped, $Cs_2LiYCl_6$ composition upon gamma-ray irradiation, according to an embodiment of the present invention.

FIG. 5 shows light emission from of $Cs_2LiYCl_6$ doped with Ce under gamma ray irradiation. There is core valence luminescence (CVL) in the 250-350 nm range and light from the dopant in the 350-450 nm range from the gamma rays. Neutrons produce light in the higher range only. A large detector results in absorption by the dopant of the CVL produced by gamma rays, and re-emission in the 350-450 run range (FIG. 5, main graph). As described herein, it has been discovered that the light produced by gamma rays, in the 250-350 nm range, is strongly absorbed by a large (e.g., thick) scintillator (light output decreases with crystal volume)(FIG. 5, inset), and re-emitted at the 350-450 nm range (light output increases with crystal volume). This being the case, a thick detector cannot take advantage of conventional methods for neutron/gamma ray discrimination based on decay time measurements, which are gamma/neutron discrimination. Because the light is being absorbed by the Ce dopant, we have discovered that to make large volume detectors Ce levels will preferably be low. The non-limiting examples shown here contain 0.05% of Ce as a dopant.

Figure 6:
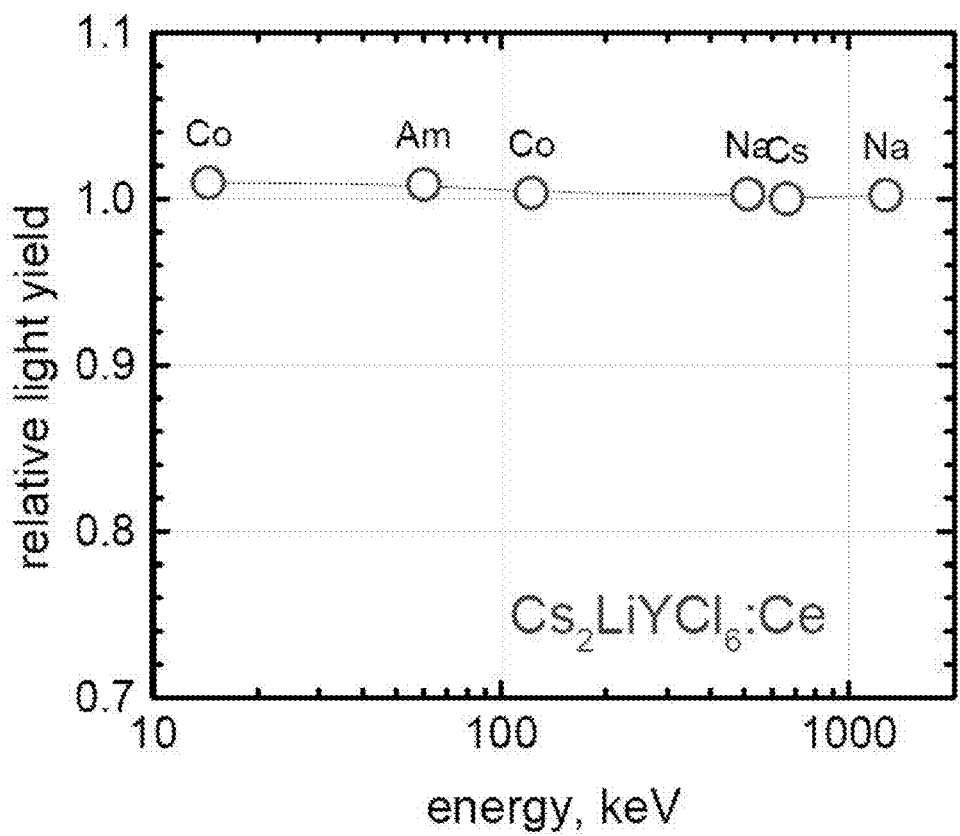
FIG. 6 illustrates proportionality for a Ce doped, $Cs_2LiYCl_6$ composition, according to an embodiment of the present invention. The figure shows light output of the composition measured under excitation from isotopes such as $^{241}Am$, $^{57}Co$, $^{22}Na$, and $^{137}Cs$.
Figure 7:
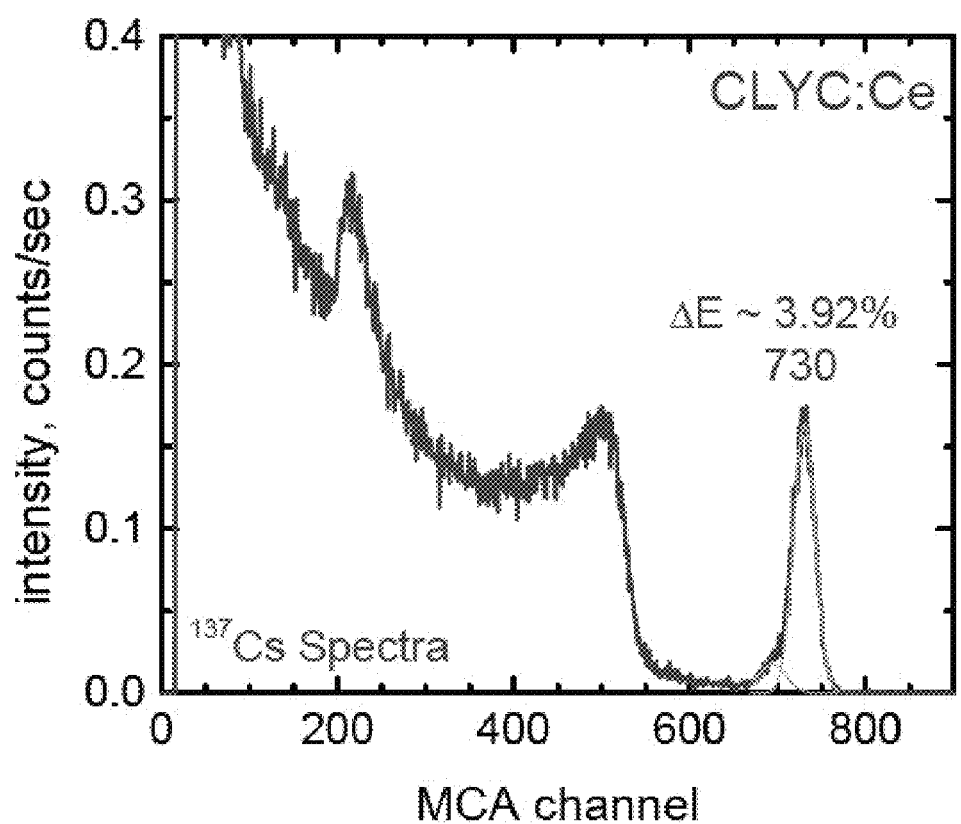
FIG. 7 illustrates an energy spectrum for a Ce doped, Li-6 enriched $Cs_2LiYCl_6$ composition, according to an embodiment of the invention. The figure shows excellent energy resolution measured for the composition.

Because of its relatively low light yield for gamma rays (22,000 photons/MeV for Cs2LiYCl6:Ce) compared to scintillators such as LaBr3 which yield 60,000 to 90,000 photons/MeV, it would be expected that the energy resolution of $Cs_2LiYCl_6$ for gamma rays will be poor, making the material less attractive for simultaneous gamma and neutron detection. Indeed, energy resolution of 7-11% for non-enriched $Cs_2LiYCl_6$ for the 662 KeV peak of Cs-137 has been reported previously (Bessiere et al, Nuclear Instruments and Methods in Physics Research A 537 (2005) pp. 242-246). Thus, while $Cs_2LiYCl_6$ has been suggested for use in differential detection of gamma-rays and neutrons, factors such as modest to poor energy resolution has limited applicability in this context. According to the present invention, however, it has been discovered that the proportionality of response of $Cs_2LiYCl_6$:Ce is very high (+/−5%) (e.g., FIG. 6) and as a consequence its energy resolution is surprisingly good, 4% for 662 keV (FIG. 7). As such, the Li-6 enriched $Cs_2LiYCl_6$ compositions of the present invention demonstrate excellent energy resolution suitable for simultaneous or differential detection of gamma-rays and neutrons.

As indicated above, scintillator compositions disclosed herein can include a dopant or a mixture of dopants. Dopants can affect certain properties, such as physical properties (e.g., brittleness, etc.) as well as scintillation properties (e.g., luminescence, etc.) of the scintillator composition. The dopant can include, for example, cerium (Ce), praseodymium (Pr), lutetium (Lu), lanthanum (La), europium (Eu), samarium (Sm), strontium (Sr), thallium (T1), chlorine (Cl), fluorine (F), iodine (I), and mixtures of any of the dopants. Where certain halides are included as dopants, such dopants will be present in the scintillator composition in addition to those halide(s) already otherwise present in the scintillator compound. The amount of dopant present will depend on various factors, such as the application for which the scintillator composition is being used; the desired scintillation properties (e.g., emission properties, timing resolution, etc.); and the type of detection device into which the scintillator is being incorporated. For example, the dopant is typically employed at a level in the range of about 0.01% to about 20%, by molar weight. In certain embodiments, the amount of dopant is in the range of about 0.01% to less than about 100% (and any integral number therebetween), or less than about 0.1%, 1.0%, 5.0%, or 20% by molar weight.

The scintillator compositions of the invention may be prepared in several different forms. In some embodiments, the composition is in a crystalline form (e.g., monocrystalline). Scintillation crystals, such as monocrystalline scintillators, have a greater tendency for transparency than other forms. Scintillators in crystalline form (e.g., scintillation crystals) are often useful for high-energy radiation detectors, e.g., those used for gamma-ray or X-ray detection. However, the composition can include other forms as well, and the selected form may depend, in part, on the intended end use of the scintillator. For example, a scintillator can be in a powder form. It can also be prepared in the form of a ceramic or polycrystalline ceramic. Other forms of scintillation compositions will be recognized and can include, for example, glasses, deposits, vapor deposited films, and the like. It should also be understood that a scintillator composition might contain small amounts of impurities. Also, minor amounts of other materials may be purposefully included in the scintillator compositions to affect the properties of the scintillator compositions.

Scintillator compositions can be substantially pure (e.g., about 99% scintillator composition or greater) or may contain certain amounts of other compounds or impurities. In some cases, impurities may originate, for example, with starting materials for composition preparation. Typically, impurities constitute less than about 0.1% by weight of the scintillator composition, and often less than about 0.01% by weight of the composition. In some instances, minor amounts of other materials may be purposefully included in the scintillator compositions. For example, minor amounts of other rare earth metals, oxides can be added to affect scintillation properties, such as reduce afterglow, and the like. Scintillator compositions can include single halide compositions as well as mixed halide compositions, e.g., where the term halide includes a mixture of two or more halides.

Methods for making crystal materials can include those methods described herein and may further include other techniques. Typically, the appropriate reactants are melted at a temperature sufficient to form a congruent, molten composition, with operative melting temperature(s) at least partially depending on the identity of the reactants themselves (see, e.g., melting points of reactants). Non-limiting examples of the crystal-growing methods can include certain techniques of the Bridgman-Stockbarger methods; the Czochralski methods, the zone-melting methods (or "floating zone" method), the vertical gradient freeze (VGF) methods, and the temperature gradient methods. See, e.g., (see also, e.g., "Luminescent Materials", by G. Blasse et al, Springer-Verlag (1994) and "Crystal Growth Processes", by J. C. Brice, Blackie & Son Ltd (1986)).

In the practice of the present invention, attention is paid to the physical properties of the scintillator material. In particular applications, properties such as hygroscopy (tendency to absorb water), brittleness (tendency to crack), and crumbliness should be minimal.

TABLE I

Properties of Scintillators

| Material | Light Output (Photons/MeV) | Density (g/cm³) | Wavelength Of Emission (nm) | Rise-time (ns) |
|---|---|---|---|---|
| NaI(T1) | 38,000 | 3.67 | 415 | >10 |
| CsI(T1) | 52,000 | 4.51 | 540 | >10 |
| LSO | 24,000 | 7.4 | 420 | <1 |
| BGO | 8,200 | 7.13 | 505 | >1 |
| BaF$_2$ | 10,000~2,000 | 4.88 | 310, slow 220, fast | <0.1 |
| GSO | 7,600 | 6.7 | 430 | ~8 |
| CdWO$_4$ | 15,000 | 8.0 | 480 | |
| YAP | 20,000 | 5.55 | 370 | <1 |

Table I provides a listing of certain properties of a number of scintillators. As shown, Li-6 enriched $Cs_2LiLn:Z_6$ compositions of the present invention demonstrate a useful light emission spectrum comparable to other commercially available scintillators. Table II further provides certain properties for a $Cs_2LiY:Cl_6$. doped with 0.05% of Ce scintillator composition, according to an embodiment of the present invention.

TABLE II

| Property | | $Cs_2LiYCl_6$:Ce | $RbGd_2Br_7$:Ce (RGB) | LiI:Eu | Li-Glass:Ce | $Li_6Gd(BO_3)_3$:Ce |
|---|---|---|---|---|---|---|
| $\lambda_{em}$, nm | | 373 | 420 | 470 | 395 | 400 |
| Light yield, | 1 neutron | 73,000 | <5,000 | 50,000 | ~6,000 | 50,000 |
| photons per | 1 MeV γ-ray | 22,000 | 56,000 | 12,000 | ~4,000 | 14,000 |
| decay time constants, ns | | 1*, 25, 2000 | 45, 400 | 1,400 | 75 | 200, 700 |
| density ρ, g/cm³ | | 3.31 | 4.8 | 4.1 | 2.5 | 3.5 |
| Pulse shape γ' - ¹n discrimination | | yes | no | no | no | no |

As set forth above, scintillator compositions of the present invention may find use in a wide variety of radiation detection and processing applications and structures. Thus, the present invention includes methods and structures for detecting energy radiation (e.g., gamma-rays, X-rays, neutron emissions, and the like) with a scintillation detector including the scintillation composition of the invention.

Figure 8A:
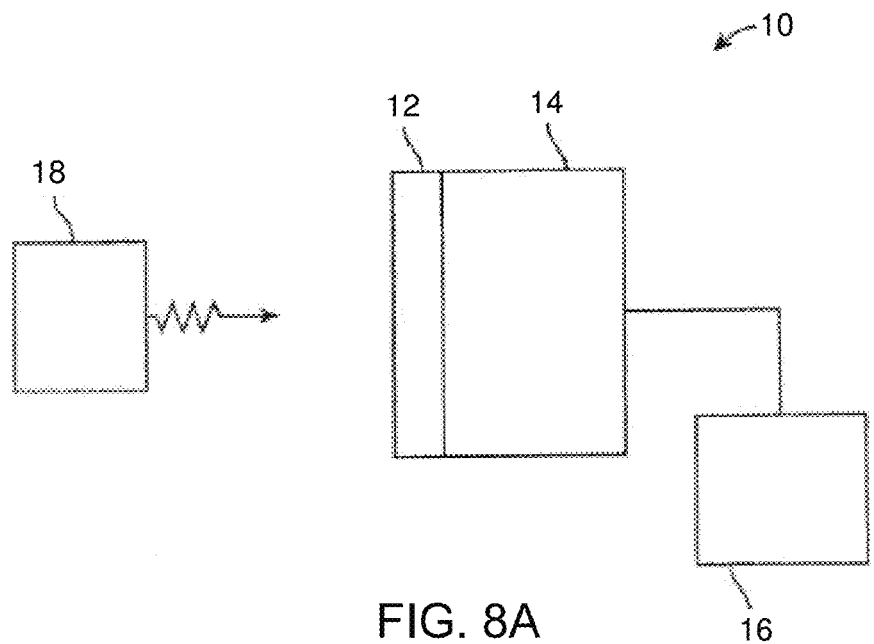
FIG. 8A is a conceptual diagram of a radiation detection system of the present invention.

FIG. 8A is a diagram of a radiation detection system or apparatus of the present invention. The detector system 10 includes a scintillator 12 optically coupled to detector assembly including a light photodetector assembly 14 or imaging device. The detector assembly of system 10 can include a data analysis or computer system 16 (e.g., data acquisition and/or processing device) to process information from the scintillator 12 and light photodetector 14. In use, the detector 10 detects energetic radiation emitted form a source 18.

A system as in FIG. 8A containing the scintillator composition (scintillator 12) of the present invention is optically coupled to the detector assembly (e.g., photodetector 14) and can include an optical window that can be disposed, e.g., at one end of the enclosure-casing. The window permits radiation-induced scintillation light to pass out of the scintillator composition assembly for measurement by the photon detection assembly or light-sensing device (e.g., photomultiplier tube, etc.), which is coupled to the scintillator assembly. The light-sensing device converts the light photons emitted from the scintillator into electrical pulses or signal that are output and may be shaped, digitized, or processed, for example, by the associated electronics.

A data analysis, or computer system thereof can include, for example, a module or system to process information (e.g., radiation detection data or signals) from the detector/photodetectors can also be included in an invention assembly and can include, for example, a wide variety of proprietary or commercially available computers, electronics, or systems having one or more processing structures, a personal computer, mainframe, or the like, with such systems often comprising data processing hardware and/or software configured to implement any one (or combination of) the method steps described herein. Any software will typically comprise machine readable code of programming instructions embodied in a tangible media such as a memory, a digital or optical recording media, optical, electrical, or wireless telemetry signals, or the like, and one or more of these structures may also be used to transmit data and information between components of the system in any of a wide variety of distributed or centralized signal processing architectures.

The detector assembly typically includes material formed from the scintillator composition described herein (e.g., one or more scintillator crystals). The detector further can include, for example, a light detection assembly including one or more photodetectors. Non-limiting examples of photodetectors include photomultiplier tubes (PMT), photodiodes, CCD sensors, image intensifiers, and the like. Choice of a particular photodetector will depend in part on the type of radiation detector being fabricated and on its intended use of the device. In certain embodiments, the photodetector may be position-sensitive.

Figure 8B:
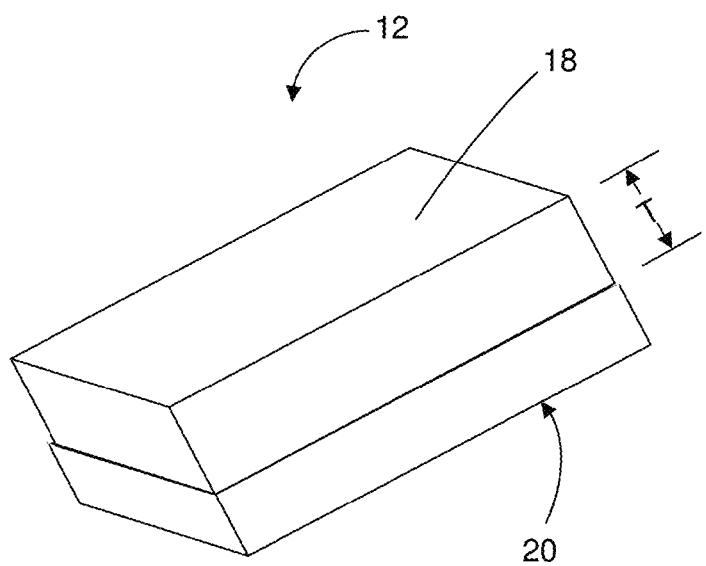
FIG. 8B is a diagram of a scintillator composition disposed on a substrate, according to an embodiment of the present invention.

FIG. 8B shows a scintillator as in scintillator 12 illustrated in FIG. 8A. Scintillator 12 includes a $Cs_2LiLn:Z_6$ composition as described above. Various sizing, shapes, dimensions, configurations of scintillator 12 may be selected depending on intended use and/or system in which the scintillator 12 is incorporated. Scintillator 12 includes a top side 18 and an opposing side (not shown) with a thickness ("T") measuring between the top side 18 or surface of the scintillator 12 and the opposing side or surface. Scintillator 12 is shown coupled to a substrate 20, which may be selected from a variety of substrates. Non-limiting substrate composition examples may include amorphous carbon, glassy carbon, graphite, aluminum, sapphire, beryllium, or boron nitrate. A substrate may include a fiber optic plate, prism, lens, scintillator, or photodetector. The substrate can be a detector device or portion or surface thereof (e.g., optical assembly, photodetector, etc.). The substrate can be separate from a detector device and/or comprise a detector portion (e.g., scintillator panel) that can be adapted to or incorporated into a detection device or assembly. In one embodiment, the scintillator is optically, but not physically, coupled to a photodetector.

The detector assemblies themselves, which can include the scintillator and the photodetector assembly, can be connected to a variety of tools and devices, as mentioned previously. Non-limiting examples include nuclear weapons monitoring and detection devices, well-logging tools, and imaging devices, such as nuclear medicine devices (e.g., PET). Scintillator compositions of the present invention, e.g., due to high-detection efficiency and/or relatively thin profile or sizing described above, can be incorporated into smaller or more compact devices or systems, including hand-held probes, detectors, or dosimeters, portal monitoring structures, and the like. Various technologies for operably coupling or integrating a radiation detector assembly containing a scintillator to a detection device can be utilized in the present invention, including various known techniques.

The detectors may also be connected to a visualization interface, imaging equipment, or digital imaging equipment. In some embodiments, the scintillator may serve as a component of a screen scintillator. For example, powdered scintillator material could be formed into a relatively flat plate, which is attached to a film, such as photographic film. Energetic radiation, e.g., X-rays, gamma-rays, neutron, originating from a source, would interact with the scintillator and be converted into light photons, which are visualized in the developed film. The film can be replaced by amorphous silicon position-sensitive photodetectors or other position-sensitive detectors, such as avalanche diodes and the like.

Neutron radiographic devices represent another important application for invention scintillator compositions and radiation detectors. Furthermore, geological exploration devices, such as well-logging devices, represent an important application for these radiation detectors. In such an embodiment, gamma-rays can be detected, which in turn provides an analysis of geological formations, such as rock strata surrounding the drilling bore holes.

Specific aspects or dimensions of any of the compositions, devices, systems, and components thereof, of the present invention may readily be varied depending upon the intended application, as will be apparent to those of skill in the art in view of the disclosure herein. Moreover, it is understood that the examples and embodiments described herein are for illustrative purposes only and that various modifications or changes in light thereof may be suggested to persons skilled in the art and are included within the spirit and purview of this application and scope of the appended claims. Numerous different combinations of embodiments described herein are possible, and such combinations are considered part of the present invention. In addition, all features discussed in connection with any one embodiment herein can be readily adapted for use in other embodiments herein. The use of different terms or reference numerals for similar features in different embodiments does not necessarily imply differences other than those which may be expressly set forth. Accordingly, the present invention is intended to be described solely by reference to the appended claims, and not limited to the preferred embodiments disclosed herein.

What is claimed is:

1. A scintillator comprising a $Cs_2LiLn$ Halide composition, wherein Ln is selected from one or more of Y, La, Ce, Gd, Lu and Sc, wherein the scintillator is capable of neutron detection at an efficiency of greater than 30%, wherein the scintillator is enriched with $Li^{-6}$.

2. The scintillator of claim 1, wherein the scintillator has a thickness of less than 10cm.

3. The scintillator of claim 1, wherein the scintillator has a thickness of less than 1cm.

4. The scintillator of claim 1, wherein the scintillator is capable of neutron detection at an efficiency of greater than 50%.

5. The scintillator of claim 1, wherein the scintillator is capable of neutron detection at an efficiency of greater than 75%.

6. The scintillator of claim 1, wherein the scintillator is capable of gamma ray detection.

7. The scintillator of claim 1, wherein the scintillator is capable of differentiating gamma ray detection from neutron detections.

8. The scintillator of claim 1, wherein the scintillator comprises a dopant.

9. The scintillator of claim 8, wherein the scintillator comprises Ce as a dopant.

10. The scintillator of claim 9, wherein the concentration of Ce in the scintillator composition is less than about 1%.

11. The scintillator of claim 1, wherein the Halide comprises Cl.

12. The scintillator of claim 1, wherein the Halide comprises I.

13. The scintillator of claim 1, wherein the Halide comprises Br.

14. The scintillator of claim 1, wherein the Halide comprises more than one Halide element.

15. The scintillator of claim 1, wherein Ln is Y.

16. A detection system comprising:
a scintillator comprising a $Cs_2LiLn$ Halide composition, wherein Ln is selected from one or more of Y, La, Ce, Gd, Lu and Sc, wherein the scintillator is capable of neutron detection at an efficiency of greater than 30%, wherein the scintillator is enriched with $Li^{-6}$; and
a detector assembly coupled to the scintillator to detect a light pulse luminescence from the scintillator as a measure of a neutron scintillation event.

17. A method of radiation detection, comprising:
providing a detection system comprising:
a scintillator comprising $Cs_2LiLn$ Halide composition, wherein Ln is selected from one or more of Y, La, Ce, Gd, Lu and Sc, wherein the scintillator is capable of neutron detection at an efficiency of greater than 30% and is enriched with $Li^{-6}$; and
a detection assembly coupled to the scintillator to detect a light pulse luminescence from the scintillator as a measure of a scintillation event; and
positioning the system such that a radiation source is within a field of view of the system so as to detect emissions from the source;
measuring a scintillation event luminescence signal from the scintillator with the detection assembly.

* * * * *